United States Patent [19]

Kawamura et al.

[11] Patent Number: 4,971,891

[45] Date of Patent: Nov. 20, 1990

[54] PHOTOPOLYMERIZABLE COMPOSITIONS CONTAINING ORGANOBORON COMPOUNDS AND PYRYLIUM OR THIOPYRYLIUM DYES

[75] Inventors: Koichi Kawamura; Yasuo Okamoto, both of Shizuoka, Japan

[73] Assignee: Fuji Photo Film Co., Ltd., Minami Ashigara, Japan

[21] Appl. No.: 256,625

[22] Filed: Oct. 12, 1988

[30] Foreign Application Priority Data

Oct. 13, 1987 [JP] Japan ................... 62-258028

[51] Int. Cl.$^5$ .................. G03C 1/73; G03F 7/027
[52] U.S. Cl. .................... 430/278; 430/781; 430/783; 430/271; 430/300; 430/915; 430/916; 522/25
[58] Field of Search ............... 430/914, 915, 916, 917, 430/337, 339, 332, 341, 281, 283, 271, 278, 300; 522/25

[56] References Cited

U.S. PATENT DOCUMENTS

| | | | |
|---|---|---|---|
| 3,775,130 | 11/1973 | Enomoto et al. | 430/915 |
| 4,307,182 | 12/1981 | Dalzell et al. | 430/339 |
| 4,343,891 | 8/1982 | Aasen et al. | 430/337 |
| 4,416,961 | 11/1983 | Drexhage | 430/7 |
| 4,474,868 | 10/1984 | Yamaoka et al. | 430/281 |

FOREIGN PATENT DOCUMENTS 62-074901  9/1985  Japan ...................... 522/25

Primary Examiner—Marion C. McCamish
Assistant Examiner—Christopher D. RoDee
Attorney, Agent, or Firm—Burns, Doane, Swecker & Mathis

[57] ABSTRACT

Disclosed is a photopolymerizable composition comprising (i) a monomer having at least one ethylenic unsaturated group which is polymerizable by means of active light, (ii) an organoboron compound, and (iii) a pyrylium or thiopyrylium dye. The composition is useful, for example, as photosensitive layers for photosensitive printing plates which are sensitive and respond to an argon laser light source.

16 Claims, No Drawings

PHOTOPOLYMERIZABLE COMPOSITIONS CONTAINING ORGANOBORON COMPOUNDS AND PYRYLIUM OR THIOPYRYLIUM DYES

FIELD OF THE INVENTION

The invention relates to photopolymerizable compositions. More particularly, the invention relates to photopolymerizable compositions which contain polymerizable compounds having ethylenic unsaturated bonds and polymerization initiators of novel composition and, as required, linear organic macromolecular polymers. The photopolymerizable compositions of this invention are useful, for example, as photosensitive layers for photosensitive printing plates which are sensitive and respond to an argon light source.

BACKGROUND OF THE INVENTION

Methods in which images are reproduced by means of photographic techniques using photosensitive compositions comprising a mixture of polymerizable polymers which have ethylenic unsaturated bonds and polymerization initiators and, as required, binding agents which have the appropriate film forming ability and thermal polymerization inhibitors, are well known at the present time. In this regard, it has been disclosed in U.S. Pat. Nos. 2,927,022, 2,902,356 and 3,870,524, that such photosensitive compositions undergo photopolymerization and are hardened and rendered insoluble when irradiated with light. Thus, by forming this type of photosensitive composition into an appropriate film and irradiating the said film with light which has passed through the prescribed negative image, it is possible to form a prescribed hardened image of the photopolymerizable composition by removing the unexposed parts of the film with an appropriate solvent (a process which is referred to below as "development"). Photosensitive compositions of this type are unquestionably very useful, for example, in making printing plates.

In the past, photosensitivity was found to be inadequate when just polymerizable compounds which had ethylenic unsaturated bonds were used. Therefore, the addition of photopolymerization initiators was suggested as a means of raising the photosensitivity. Benzil, benzoin, benzoin ethyl ether, Michler's ketone, anthraquinone, acridine, phenazine, benzophenone, and 2-ethylanthraquinone have been used for this purpose. However, when these photopolymerization initiators have been used, long imagewise exposures are required to form the image, because the hardening sensitivity and reactivity of the photopolymerizable composition is reduced. Consequently, it is difficult to reproduce fine images with good picture quality if there is any vibration during the operation. Also, consideration must be given to dispersing the large amounts of heat which are produced since the amount of energy radiated by the light source used for making the exposure must be increased. There are also problems concerning deformation and deterioration of the film which has been formed due to the heat.

Photopolymerization initiators typically have a much lower photopolymerization effect with light sources in the visible region above 400 nm than they do with light sources in the ultraviolet region below 400 nm. Therefore, photopolymerizable compositions which contain conventional photopolymerization initiators are limited in their range of application.

There have been some suggestions made in the past in connection with the development of photopolymerization systems which respond to visible light rays. For example, it has been reported in U.S. Pat. No. 2,850,445 that certain types of photoreducing dyes such as rose bengal, eosin, and erythrocine have effective responsiveness to visible light. Other attempts at improving the technique include the use of conjugate initiator systems consisting of dyes and amines (JP-B-44-20189) (the term "JP-B" as used herein signifies "examined Japanese Patent publication"), system containing a hexaarylbiimidazole with a radical generator and a dye (JP-B-45-37377), systems consisting of a hexaarylbiimidazole and a p-dialkylaminobenzylideneketone (JP-A-47-2528 and JP-A-54-155292) corresponding to U.S. Pat. No. 4,162,162 (the term "JP-A" as used herein signifies "unexamined published Japanese patent application"), systems consisting of 3-keto substituted coumarin compounds and active halogen compounds (JP-A-58-15503 corresponding to U.S. Pat. No. 4,505,793), and systems consisting of substituted triazines and merocyanine dyes (JP-A-54-151024). These techniques have been effective with respect to visible light beams, but have yet to achieve a satisfactory photosensitive rate. Therefore, there is a need for further improvement of these techniques.

In recent years, increased sensitivity to ultraviolet light and methods of forming pictures using lasers have been investigated and UV projection exposure methods, for the production of printing plates, direct laser plate making, laser facsimilie and holography, have already reached a practical stage. Photosensitive materials of high sensitivity have been developed to correspond with these techniques. However, adequete sensitivity of these materials has yet to be achieved.

SUMMARY OF THE INVENTION

The present invention provides photopolymerizable compositions of high sensitivity.

Thus, an object of the invention is, in broad terms, to provide photopolymerizable compositions which contain photopolymerization initiators which increase the photopolymerization rates of photopolymerizable compositions which contain polymerizable compounds having ethylenic unsaturated bonds. Furthermore, another object of the invention is to provide photopolymerizable compositions which contain photopolymerization initiators which have high sensitivity to visible light above 400 nm, and especially to light close to 488 nm corresponding to the output of an Ar+ laser.

As a result of extensive research carried out with a view to realizing the above mentioned objects, the inventors have discovered that certain specified photopolymerization initiator systems can achieve these objects. That is, certain systems bring about a marked increase in the photopolymerization rate of polymerizable compounds which have ethylenic unsaturated bonds and they also exhibit a high sensitivity even to visible light of 400 nm and above. More particularly, the present invention is based upon the discovery that the aforementioned objects can be realized by using photopolymerizable compositions in which, in photopolymerizable compositions which contain addition polymerizable compounds which have at least one ethylenic unsaturated bond, photopolymerization initiators and, as required, linear organic macromolecular polymers, the photopolymerization initiators comprise a combination of pyrylium dyes or thiopyrylium dyes and compounds which can be represented by the general formula [I].

General Formula [I]

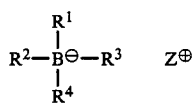

In the above formula, $R^1$, $R^2$, $R^3$ and $R^4$, which may be the same or different, each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and at least two of said $R^1$, $R^2$, $R^3$ and $R^4$, may combine to form a cyclic structure, with the proviso that at least one of $R^1$, $R^2$, $R^3$ and $R^4$ is an alkyl group, and wherein $Z^\oplus$ represents an alkali metal cation or a quaternary ammonium cation.

DETAILED DESCRIPTION OF THE PREFERRED EMBODIMENTS

The polymerizable compounds having ethylenic unsaturated bonds which can be used in the invention, are compounds which have at least one ethylenic unsaturated bond within their chemical structure. For example, they may have the chemical form of a monomer or a prepolymer, which is to say a dimer, trimer or an oligomer, or they may be in the form of a mixture or copolymer of such forms. Examples of monomers and copolymers include esters of unsaturated carboxylic acids and aliphatic polyhydric alcohol compounds, amides of unsaturated carboxylic acids and aliphatic polyaminoamine compounds.

Actual examples of monomeric esters of aliphatic polyhydric alcohol compounds and unsaturated carboxylic acids include acrylic acid esters such as ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyesteracrylate oligomers.

Examples of methacrylic acid esters include tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis-[p-(3-methacryloxy-2-hydroxypropoxy)-phenyl]dimethylmethane, and bis-[p-(acryloxyethoxy)-phenyl]dimethylmethane.

Examples of itaconic acid esters include ethyleneglycol diitaconate, propyleneglycol diitaconate, 1,3-butanediol diitaconate, 1,4-butanediol diitaconate, tetramethyleneglycol diitaconate, pentaerythritol diitaconate, and sorbitol tetraitaconate.

Examples of crotonic acid esters include ethyleneglycol dicrotonate, tetramethyleneglycol dicrotonate, pentaerythritol dicrotonate, and sorbitol tetradicrotonate.

Examples of isocrotonic acid esters include ethyleneglycol diisocrotonate, pentaerythritol diisocrotonate, and sorbitol tetraisocrotonate.

Examples of maleic acid esters include ethyleneglycol dimaleate, triethyleneglycol dimaleate, pentaerythritol dimaleate, and sorbitol tetramaleate.

Moreover, mixtures of the ester monomers described above can also be used.

Furthermore, actual examples of monomeric amides of aliphatic polyaminoamines and unsaturated carboxylic acids include methylenebis-acrylamide, methylenebismethacrylamide, 1,6-hexamethylenebis-acrylamide, 1,6-hexamethylenebis-methacrylamide, diethylenetriamine trisacrylamide, xylylenebis-acrylamide, and xylylenebismethacrylamide.

Examples of other suitable compounds include vinyl urethane compounds which have two or more polymerizable vinyl groups in one molecule where a vinyl monomer which has a hydroxyl group as indicated by the general formula [A] below has been added to a polyisocyanate compound which has two or more isocyanate groups in one molecule as disclosed in JP-B-48-41708

$$CH_2=C(R)COOCH_2CH(R')OH \quad [A]$$

wherein R and R' represent hydrogen atoms or methyl groups.

Furthermore, urethane acrylates such as those disclosed in JP-A-51-37193, polyester acrylates such as those disclosed in JP-A-48-64183 and JP-B-49-43191 and JP-B-52-30490, and polyfunctional acrylates and methacrylates such as epoxyacrylates in which (meth)acrylic acid has been reacted with an epoxy resin etc. can also be used for this purpose. Moreover, the materials introduced as photocurable monomers and oligomers on pages 300 to 308 of the Journal of Adhesion Society of Japan, Volume 20, No. 7 (1984), can also be used for this purpose. Moreover, the amounts of these material used are from 5 to 50 wt % (indicated hereinafter simply as "%"), and preferably from 10 to 40%.

The photopolymerization initiators which are useful in the photopolymerizable compositions of the present invention are described below. As noted above, the organoboron compounds which can be used effectively in the invention may be represented by the general formula [I]

In the above formula, $R^1$, $R^2$, $R^3$ and $R^4$, which may be the same or different, each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and at least two of said $R^1$, $R^2$, $R^3$ and $R^4$, may combine to form a cyclic structure, with the proviso that at least one of $R^1$, $R^2$, $R^3$ and $R^4$ is an alkyl group, and wherein $Z^\oplus$ represents an alkali metal cation or a quaternary ammonium cation.

An alkyl group represented by $R^1$ to $R^4$ includes a straight, branched or cyclic alkyl group and preferably has 1 to 18 carbon atoms, such as a methyl group, an ethyl group, a propyl group, an isopropyl group, a butyl group, a pentyl group, a hexyl group, an oxtyl group, a stearyl group, a cyclobutyl group, a cyclopentyl group, a cyclohexyl group, etc.

A substituted alkyl group represented by $R^1$ to $R^4$ includes an alkyl group described above having a substituent, such as a halogen atom, e.g., a chlorine atom, a bromine atom, etc; a cyano group; a nitro group; an aryl group, preferably, a phenyl group; a hydroxyl group; a $—N=R^5R^6$ group, wherein $R^5$ and $R^6$ each represents a hydrogen atom, an alkyl group having 1 to 14 carbon atoms or an aryl group; a $—COOR^7$ group, wherein $R^7$ represents a hydrogen atom, an alkyl group having 1 to 14 carbon atoms or aryl group; a $—OCOR^8$ group or a $—OR^8$ group, wherein $R^8$ represents an alkyl group having 1 to 14 carbon atoms or an aryl group.

An aryl group represented by $R^1$ to $R^4$ includes an aryl group having 1 to 3 rings, such as a phenyl group, a naphthyl group, etc., and a substituted aryl group represented by $R^1$ to $R^4$ includes an aryl group described above having the same substituent as that for the alkyl group or an alkyl group having 1 to 14 carbon atoms.

An alkenyl group represented by $R^1$ to $R^4$ includes a straight, branched or cyclic alkenyl group having 2 to 18 carbon atoms and a substituent for the alkenyl group includes the same substituent as that for the alkyl group.

An alkynyl group represented by $R^1$ to $R^4$ includes a straight or branched alkynyl group having 2 to 18 carbon atoms, and a substituent for the alkynyl group includes the same substituent as that for the alkyl group.

A heterocyclic group represented by $R^1$ to $R^4$ includes a 5 or more-membered ring, preferably 5 to 7 membered ring containing at least one atom selected from the group consisting of N, S and O, and the heterocyclic ring may contain a condensed ring. The substituent for the heterocyclic group includes the same substituent as that for the aryl group.

Actual examples of these compounds are indicated below. The compounds disclosed in U.S. Pat. Nos. 3,567,453 and 4,343,891, and in European Pat. Nos. 109,772 and 109,773 are also suitable.

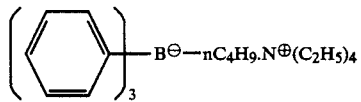
(a)

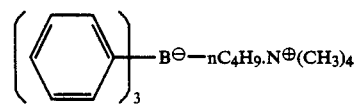
(b)

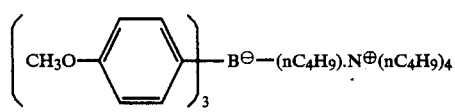
(c)

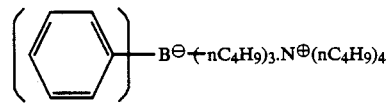
(d)

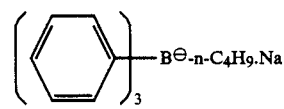
(e)

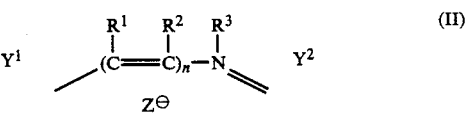
(f)

Compounds which have the general formula (II) or (III) indicated below can be used as the pyrylium dyes or thiopyrylium dyes which are used in the invention.

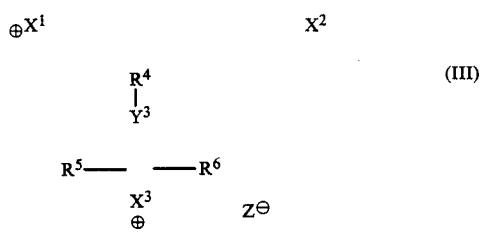

In the above mentioned formulae, $X^1$, $X^2$ and $X^3$ may be the same or different, each representing oxygen or sulfur; $Y^1$, $Y^2$ and $Y^3$ may be the same or different, each representing the atoms required to complete a six or ten membered substituted or unsubstituted unsaturated heterocyclic group which contains one oxygen atom or sulfur atom as the hetero atom and 5 or 9 carbon atoms; $R^1$, $R^2$ and $R^3$ may be the same or different, each representing a hydrogen atom, halogen atom, cyano group, nitro group, substituted or unsubstituted alkyl group of which the alkyl group has from 1 to about 4 carbon atoms, or a substituted or unsubstituted aryl group such as a phenyl group or an alkoxyphenyl group; $R^4$, $R^5$ and $R^6$ may be the same or different, each representing a substituted or unsubstituted alkyl of which the alkyl group has from 1 to about 10 carbon atoms, or a substituted or unsubstituted aryl group such as a phenyl group, alkoxyphenyl group, aminophenyl group, or dialkylaminophenyl group, or a substituted alkenyl group such as a styryl group, or p-dialkylaminostyryl group; $Z^-$ represents an anion such as the acid group of perchloric acid, fluoroboric acid, hexafluoroboric acid, sulfuric acid or hydrochloric acid; and n is an integer of value 0, 1, 2 or 3.

In preferred embodiments of the invention, $R^1$ to $R^3$ in general formula (II) are the same or different, each being a hydrogen atom or an alkyl group which has from 1 to 4 carbon atoms, the heterocyclic group which contains $Y^1$ may be a group which may be represented by either of the general formulae (IV) and (V) which are indicated below, and the heterocyclic group which contains $Y^2$ may be a group which can be represented by either of the general formulae (VI) and (VII) which are indicated below:

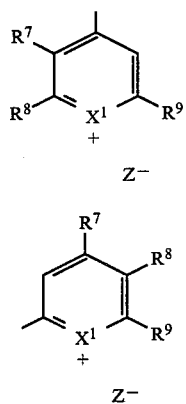
(IV)

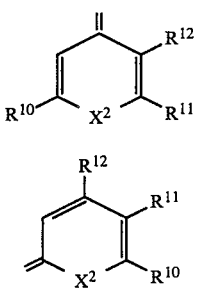
(V)

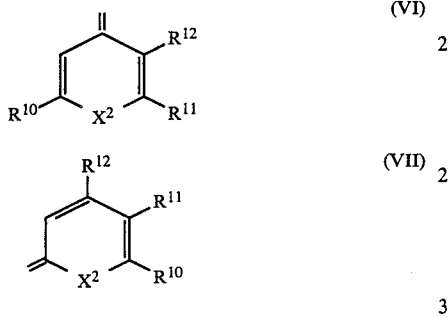
(VI)

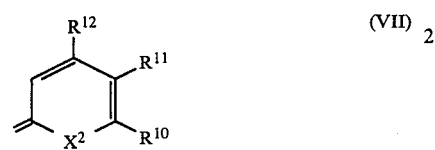
(VII)

Moreover, the heterocyclic group which contains $Y^3$ may be a group which can be represented by either of the general formulae (VIII) and (IX) which are indicated below.

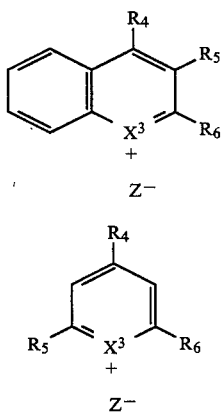
(VIII)

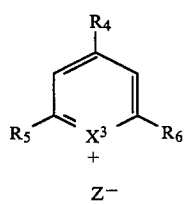
(IX)

In the formulae above, $X^1$, $X^2$ and $X^3$ may be the same or different, each representing an oxygen atom or a sulfur atom; Z is the same as above; n is 0, 1 or 2; $R^4$, $R^5$ and $R^6$ are the same as above but at least one of $R^4$, $R^5$ and $R^6$ is a substituted or unsubstituted aryl group such as an alkoxyphenyl group, or a dialkylaminophenyl group, or a substituted alkenyl group such as a styryl group; $R_7$, $R_8$, $R_9$, $R_{10}$, $R_{11}$, and $R_{12}$ may be the same or different, each representing substituted or unsubstituted alkyl groups of which the alkyl group has from 1 to 4 carbon atoms or substituted or unsubstituted aryl groups as described in connection with $R^1$ to $R^3$ above, or alternatively, any of $R_7$ to $R_{12}$ may represent a group of atoms which is required, together with any group which is bound to the adjacent nuclear carbon atom, to complete an aryl ring.

Although the preferred (thia)pyrylium dye used in the invention is shown by the heterocyclic structural formulae (IV) to (IX) above, it will be appreciated that many similar structures are included within the scope of the invention.

The (thia)pyrylium dyes of the invention can be manufactured using already known methods. Examples of such methods for their manufacture have been published in JP-A-54-14974 (corresponding to U.S. Ser. No. 813,371 filed July 6, 1977), in U.S. Pat. No. 3,586,500 and in *Tetrahedron,* Volume 29, page 795 (1973).

Actual examples of (thio)pyrylium dyes which can be usefully employed in the invention are indicated

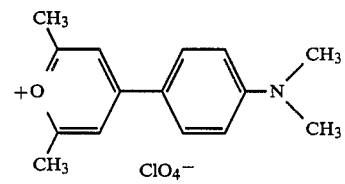
1

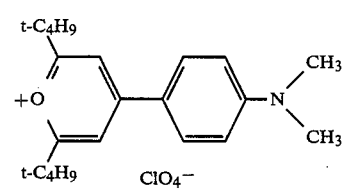
2

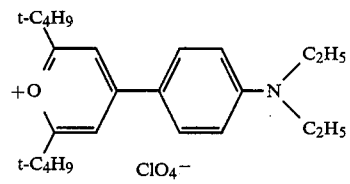
3

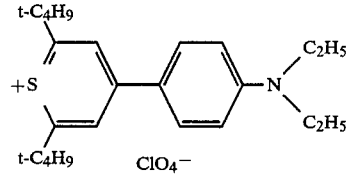
4

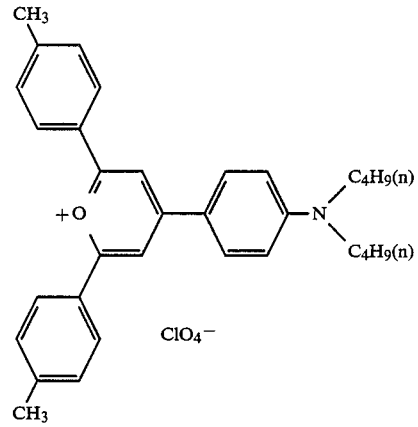
5

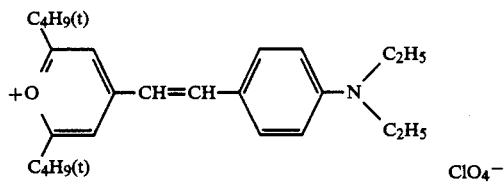

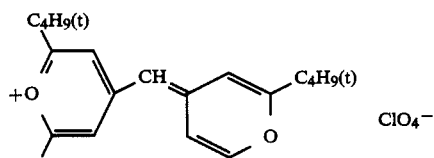

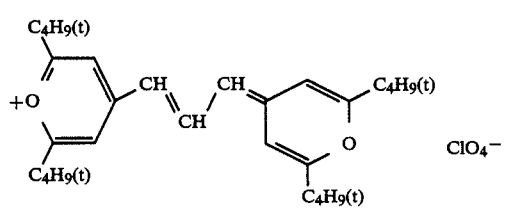

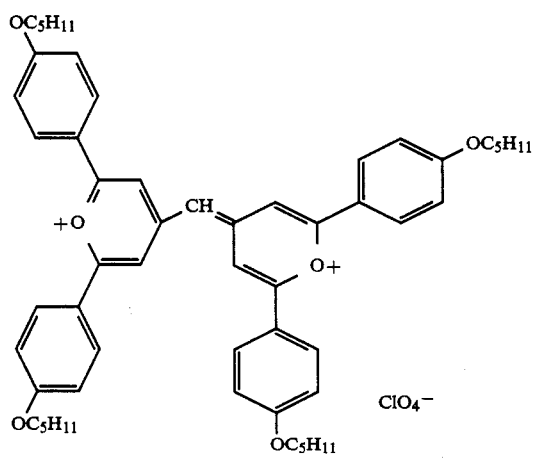

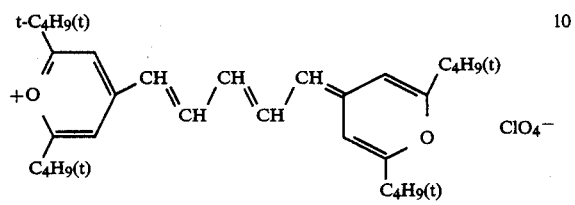

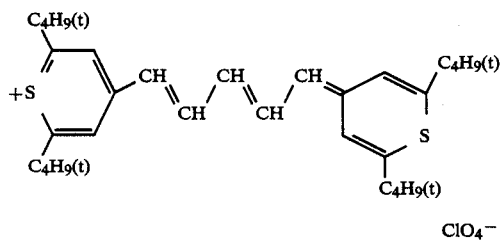

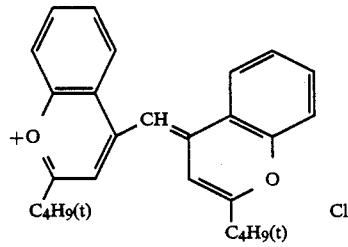

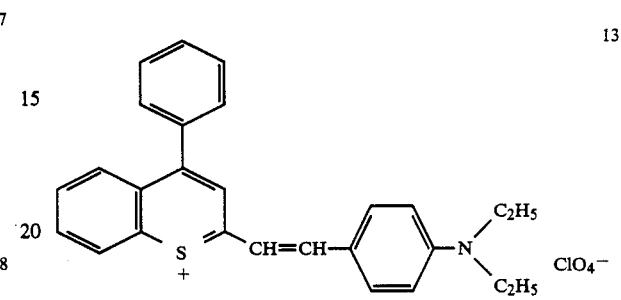

The concentration of the above described polymerization initiator systems in the compositions of the present invention is normally low. In this regard, n cases where unsuitably large amounts are used they have undesirable effects, such as cutting off the effective light rays. The amount of the photopolymerization initiator system in this invention is preferably within the range from 0.01% to 60%, and most desirably within the range from 1% to 30%, with respect to the total amount of the polymerizable ethylenic unsaturated compound and the linear organic macromolecular polymer which is added as required.

In the photopolymerization initiator system according to the present invention, the organoboron compound is suitably used in an amount of from 0.05 to 30 parts, preferably from 0.1 to 10 parts, more preferably from 0.2 to 5 parts, by weight per part by weight of the pyrylium or thiopyrylium dye.

Furthermore, various organic amine compounds can be used conjointly, as required, in the photopolymerizable compositions of this invention. It is possible to increase the photopolymerization initiation ability further. Examples of these organic amine compounds include triethanolamine, dimethylamine, diethanolaniline, ethyl p-dimethylaminobenzoate, and Michler's ketone. The amount of organic amine compound added is preferably some 50% to 200% of the total amount of polymerization initiator.

The photopolymerization initiation capacity can be increased further by adding hydrogen donating compounds such as N-phenylglycine, 2-mercaptobenzothiazole, and alkyl esters of N,N-dialkyl benzoic acid, as required, to the photopolymerization initiators used in the invention.

Also, the photopolymerization initiation capacity can be increased by the conjoint use of various radical generating agents in the photopolymerizable compositions of this invention. Examples of such compounds include aromatic onium salts, aromatic halonium salts, hexaarylbiimidazole derivatives, organic peroxides, benzophenones, and thioxantoin derivatives.

The "linear organic macromolecular polymers" which can be used in the invention may be any such polymer provided that it is compatible with the photopolymerizable ethylenic unsaturated compound. Preferably a linear organic macromolecular polymer which is soluble or swelled by the water or weak aqueous alkali which has an aqueous developing or weak aqueous alkaline developing capacity is used. The linear organic macromolecular polymer is used not only as a film forming agent for the composition but also, depending of the application, as a water, weak aqueous alkali or organic solvent developing agent. For example, water development is possible when a water soluble organic macromolecular polymer is used. Linear organic macromolecular polymers of this type are addition polymers which have carboxylic acid groups on side chains, such as those disclosed, for example, in JP-A-59-44615, JP-B-54-34327 corresponding to U.S. Pat. No. 3,804,631, JP-B-58-12577 corresponding to U.S. Pat. No. 3,930,865 and JP-B-54-25957 corresponding to U.S. Pat. No. 4,239,849, and JP-A-54-92723, JP-A-59-53836 corresponding to U.S. Pat. No. 4,687,727and JP-A-59-71048 corresponding to U.S. Pat. No. 4,537,855. That is, suitable such polymers are methacrylic acid copolymers, acrylic acid copolymers, itaconic acid copolymers, crotonic acid copolymers, maleic acid copolymers, and partially esterified maleic acid copolymers. Similarly, it may be an acidic cellulose derivative which has carboxylic acid groups on side chains. Moreover, it may also be a polymer in which a cyclic acid anhydride has been added to an addition polymer which has hydroxyl groups. Of these materials, benzyl(meth)acrylate/(meth)acrylic acid copolymers and allyl(meth)acrylate/(meth)acrylic acid copolymers are preferred. Polyvinylpyrrolidone and poly(ethylene oxide) can also be used as water soluble linear organic macromolecules. Furthermore, alcohol soluble polyamide and 2,2-bis-(4-hydroxyphenyl)propane and epichlorohydrin polyether can be used in order to raise the strength of the hardened film.

The linear organic macromolecular polymers can be mixed in an arbitrary amount in the whole composition. However, if more than 90 wt % is used, the desired effect is not achieved with respect to the strength of the image which is formed. The amount added is preferably from 30 to 85%. Furthermore, the photopolymerizable ethylenic unsaturated compound and the linear organic macromolecular polymer are preferably used in proportions by weight within the range from 1/9 to 7/3, and most desirably in proportions by weight within the range from 3/7 to 5/5.

The addition of a small amount of a thermal polymerization inhibitor as well as the basic components indicated above is desirable in the present invention in order to prevent the occurrence of unwanted thermal polymerization of the polymerizable ethylenic unsaturated compound during the manufacture or storage of the photosensitive composition. Appropriate thermal inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, N-nitrosophenylhydroxylamine, and cerous salts. The amount of thermal polymerization inhibitor added is preferably from about 0.01% to about 5% with respect to the weight of the whole composition. Behenic acid and higher fatty acid derivatives such as behenic acid amides may also be added to float on the surface in order to prevent inhibition of the polymerization by oxygen. The amount of higher fatty acid derivative added is preferably from about 0.5% to about 10% with respect to the whole composition. Moreover, dyes or pigments may be added with the intention of coloring the photosensitive layer. The amount of dye or pigment added is preferably from about 0.5% to about 5% of the whole composition. Furthermore, inorganic fillers and other known additives may be added to improve the properties of the hardened film.

Photopolymerizable compositions of the present invention can be supplied for use as solutions in various organic solvents when coating. Solvents which can be used for this purpose include acetone, methyl ethyl ketone, cyclohexane, ethyl acetate, ethylene dichloride, tetrahydrofuran, toluene, ethyleneglycol monomethyl ether, ethyleneglycol monoethyl ether, ethyleneglycol dimethyl ether, propyleneglycol monoethyl ether, propyleneglycol monoethyl ether, acetylacetone, cyclohexanone, diacetonealcohol, ethyleneglycol monomethyl ether acetate, ethyleneglycol ethyl ether acetate, ethyleneglycol monoisopropyl ether, ethylene glycol monobutyl ether acetate, 3-methoxypropanol, methoxymethoxyethanol, diethyleneglycol monomethyl ether, diethyleneglycol monoethyl ether, diethyleneglycol dimethyl ether, diethyleneglycol diethyl ether, propyleneglycol monomethyl ether acetate, propyleneglycol monoethyl ether acetate, 3-methoxypropyl acetate, N,N-dimethylformamide, dimethylsulfoxide, $\gamma$-butyrolactone, methyl lactate, and ethyl lactate. These solvents may be used individually or in the form of mixtures. The concentration of solids in the coating solution is suitably from 2 to 50 wt %.

The amount coated is suitably within the range, in terms of weight after drying, from about 0.1 gram per square meter to about 10 grams per square meter. Most desirably the amount coated is from 0.5 to 5 grams per square meter.

For the support, a dimensionally stable sheet like material is used. Dimensionally stable sheet like materials include paper, paper which has been laminated with a plastic (for example, with polyethylene, polypropylene, or polystyrene), metal plates made from materials such as aluminum (including aluminum alloys), zinc, and copper, plastic films made from, for example, cellulose diacetate, cellulose triacetate, cellulose propionate, cellulose butyrate, cellulose acetate butyrate, cellulose nitrate, polyethyleneterephthalate, polyethylene, polystyrene, polypropylene, polycarbonate, and polyvinylacetal, and paper and plastic films on which metals such as those indicated above have been laminated or vapor deposited. Of these supports the use of aluminum films is preferred in view of their dimensional stability and low cost. Moreover, composite sheets where an aluminum sheet has been bonded to a polyethyleneterephthalate film, such as those disclosed in JP-B-48-18327 corresponding to B.P. 1,329,714, are also desirable.

Furthermore, supports which have a surface of a metal, and particularly an aluminum, are preferably subjected to a surface treatment such as a graining treatment, dipping in an aqueous solution of sodium silicate, potassium fluorozirconate, or phosphates, or an anodic oxidation process.

The use of aluminum sheets which have been subjected to a dipping treatment in an aqueous sodium silicate solution after graining is preferred. Of the aluminum sheets which have been subjected to an anodic oxidation process, the use of those which have been dipped in an aqueous solution of an alkali-metal silicate are preferred such as those disclosed in JP-B-47-5125 corresponding to U.S. Pat. No. 3,181,461. The above mentioned anodic oxidation treatment can be carried out by establishing the aluminum sheet as the anode in an electrolyte of an aqueous or non-aqueous solution of an inorganic acid such as phosphoric acid, chromic acid, sulfuric acid, or boric acid, or an organic acid such as oxalic acid, or sulfamic acid, or salts of these acids, and passing an electrical current. The above mentioned acids and salts may be present in the electrolyte either individually or in combinations of two or more.

Silicate electrodeposition as disclosed in U.S. Pat. No. 3,658,662 is also effective.

Surface treatments in which the above mentioned anodic oxidation treatments and sodium silicate treatments are combined with a support which has been provided with electrolytic grain are also useful. Such methods are disclosed, for example, in JP-B-46-27481 and JP-A-52-58602 corresponding to U.S. Pat. No. 4,087,341 and JP-A-52-30503.

Furthermore, supports which have been subjected sequentially to mechanical roughening, chemical etching, electrolytic graining, anodic oxidation and a sodium silicate treatment as disclosed in JP-A-56-28893 corresponding to U.S. Pat. No. 4,476,006 are also preferred.

Sheets which have been undercoated with a water soluble resin, for example poly(vinyl phosphonic acid), polymers and copolymers which have sulfonic acid groups in side chains, poly(acrylic acid), water soluble metal salts (for example zinc borate) or yellow dyes, amine salts etc. after the execution of these treatments are also preferred. These treatments which render the material hydrophilic are carried out not only to render the surface of the support hydrophilic but also to prevent the occurrence of harmful reactions of the photopolymerizable compositions which are established thereon and to increase the level of adhesion of the photosensitive layer.

A protective layer of a polymer which has oxygen barrier properties, such as poly(vinyl alcohol), and acidic celluloses, may also be established on top of a layer of photopolymerizable composition which has been established on a support. This aids in the prevention of polymerization inhibiting action due to atmospheric oxygen. Methods for the coating of such protective films have been disclosed, for example, in U.S. Pat. No. 3,458,311 and JP-B-55-49729.

The photopolymerizable compositions of the present invention can be used for normal photopolymerization reactions. They can be used for many purposes such as photoresists during the manufacture of printed circuit boards, printing plates etc. Good effects can be obtained when the invention is applied to photosensitive materials for use with a visible light laser, such as an Ar+ laser, as a result of the high speed and wide spectral sensitivity extending into the visible region.

Printing plates in which photopolymerizable compositions of the present invention are used may be imagewise exposed to light and the image can then be obtained by removing the unexposed parts of the photosensitive layer with a development bath. The preferred development bath when these photopolymerizable compositions are used as lithographic printing plates, are those disclosed in JP-B-47-7427, and aqueous solutions of inorganic alkalis such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, and aqueous ammonia, and aqueous solutions of organic alakalis such as monoethanolamine or diethanolamine, are suitable for this purpose. The concentration of the said alkaline solution is from 0.1 to 10 wt %, and preferably from 0.5 to 5 wt %.

Furthermore, small amounts of surfactants or organic solvents such as benzyl alcohol, 2-phenoxyethanol and 2-butoxyethanol can be added, as required, to the alkaline aqueous solution. For example, use can be made of those disclosed in U.S. Pat. Nos. 3,375,171 and 3,615,480.

Moreover, the development baths disclosed in JP-A-50-26601 and JP-A-58-54341 and in JP-B-56-39464 and JP-B-56-42860 corresponding to U.S. Pat. No. 4,186,006 are also particularly useful.

The photopolymerizable compositions of the present invention have a high sensitivity to actinic light over a wide range extending from ultraviolet light to visible light. Therefore, ultra-high pressure, high pressure, intermediate pressure or low pressure mercury lamps, chemical lamps, carbon arc lamps, xenon lamps, metal halide lamps, various visible and ultraviolet laser lamps, fluoresent lamps, tungsten lamps and sunlight can be employed as light sources.

The (thia)pyrylium dyes used in the invention have a peak absorption near to 488 nm which is the output wavelength of the argon laser. Thus, they are especially useful in lithographic applications where a laser is used in the interest of brevity and conciseness, the contents of the aforementioned numerous patents and articles are hereby incorporated by reference.

The invention will now be described further by the following Examples, but it is in no way limited by the Examples. All percents are by weight unless otherwise indicated.

EXAMPLES 1 TO 2

The surface of an aluminum sheet of thickness 0.30 mm was subjected to a graining treatment with an aqueous suspension of 400 mesh pumice stone and a nylon brush, after which it was washed thoroughly with water. The surface was then etched by immersion for 10 seconds in 10% sodium hydroxide at a temperature of 70° C. and washed with water. It was then subjected to a neutralizing wash with 20% nitric acid and then it was washed with water. It was then subjected to an electrolytic roughening treatment with an anodic quantity of 160 coulomb/dm² in a 1% aqueous nitric acid solution using a sinusodial alternating current under conditions of $V_A=12.7$ V. The measured surface roughness was 0.6μ (expressed as Ra). The sheet was then dipped into 30% aqueous sulfuric acid solution and desmutted for a period of 2 minutes at 55° C., after which it was subjected to an anodic oxidation treatment of 2 minutes duration in 20% aqueous sulfuric acid solution at a current density of 2 A/dm² to a thickness of 2.7 grams per square menter.

Photosensitive liquids of the composition indicated below was coated onto the aluminum sheet which had been treated in this way to provide a dry coated weight of 1.5 grams per square meter, and the coating was dried for 2 minutes at 80° C. to form a photosensitive layer.

| | |
|---|---|
| Pentaerythritol tetraacrylate | 2.0 grams |
| allyl methacrylate/methacrylic acid Copolymer (copolymer mol ratio: 80/20) | 2.0 grams |
| Initiator | X grams |
| Copper phthalocyanine pigment | 0.2 gram |

| | | |
|---|---|---|
| Fluorine based non-ionic surfactant ["Fluorad FC-430" (product name), made by the 3M Company] | 0.03 gram | |
| Methyl ethyl ketone | 20 grams | |
| Propyleneglycol monomethyl ether acetate | 20 grams | |

A 3 wt % aqueous solution of poly(vinyl alcohol) (saponification 86.5 to 89 mol %, degree of polymerization 1000) was coated over this photosensitive layer to provide a dry coated weight of 2 grams pre square meter and this was dried for 2 minutes at 100° C.

Photosensitivity tests in visible light were carried out using visible light. The visible light was obtained by passing the light from a tungsten lamp light source through a Kenko optical filter SC40. A Fuji PS step guide (made by the Fuji Photo Film Co., Ltd., a step tablet with an initial transmission optical density of 0.05, increasing sequentially in 15 steps of 0.15) was used for measuring sensitivities. The level of illumination at the surface of the sensitive material film was 200 Lux and the number of clear steps of the PS step guide on exposure for 120 seconds was used as a measure of the sensitivity.

Development was carried out by immersion for 1 minute in the development bath indicated below at a temperature of 25° C.

| | |
|---|---|
| 1K Potassium silicate | 30 grams |
| Potassium hydroxide | 15 grams |
| $C_{12}H_{25}$-phenyl-O-phenyl-$SO_3Na$ | 3 grams |
| Water | 1000 grams |

The results obtained for the sensitivity on changing the composition of the photopolymerization initiator are shown in Table 1.

TABLE 1

| | Photopolymerization Initiator | Amount added (gram) | Number of Clear Steps with light passed through an SC40 filter |
|---|---|---|---|
| Example 1 | Compound No. 1 | 0.05 | 8.5 |
| | Compound No. b | 0.05 | |
| Example 2 | Compound No. 8 | 0.05 | 6.0 |
| | Compound No. b | 0.05 | |
| Comparative Example 1 | Compound No. 1 | 0.05 | No image formed |
| Comparative Example 2 | Compound No. 2 | 0.05 | No image formed |

This Example was carried out in the same manner as Examples 1 and 2 except that trimethylolpropane tri(acryloyloxypropyl) ether was used as the polymerizable monomer in place of the pentaerythritol tetraacrylate and the exposure was made with light of 490 nm using a band pass filter (amount of light 0.56 mJ/m²)

The results obtained are shown in Table 2.

TABLE 2

| | Photo-polymerization Initiator | Amount Used (gram) | Number of Clear Steps |
|---|---|---|---|
| Example 3 | Compound No. 1 | 0.044 | 6 |
| | Compound No. b | 0.045 | |
| Comparative Example 3 | Compound S (see below) | 0.08 | 2 |
| | Compound No. b | 0.045 | |

Compound S

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising, (i) a monomer having at least one ethylenic unsaturated group which is polymerizable by means of active light, (ii) a compound represented by the general formula [I]:

$$R^2-\overset{R^1}{\underset{R^4}{\overset{|}{B}}}{}^{\ominus}-R^3\ Z^{\oplus} \qquad [I]$$

wherein the groups, $R^1$, $R^2$, $R^3$ and $R^4$, which may be the same or different, each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and at least two of said $R^1$, $R^2$, $R^3$ and $R^4$, may combine to form a cyclic structure, with the proviso that at least one of $R^1$, $R^2$, $R^3$ and $R^4$ is an alkyl group, and wherein $Z^{\oplus}$ represents an alkali metal cation or a quaternary ammonium cation, and (iii) a pyrylium or thiopyrylium dye.

2. A photopolymerizable composition according to claim 1, further comprising a linear organic macromolecular polymer.

3. A photopolymerizable composition according to claim 1 wherein the monomer (i) is selected from an ester of an unsaturated carboxylic acid, an ester of an aliphatic polyhydric alcohol compound, an amide of an unsaturated carboxylic acid, and an amide of an aliphatic polyaminoamine compound.

4. A photopolymerizable composition according to claim 1 wherein component (ii) is selected from the group of:

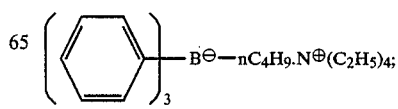

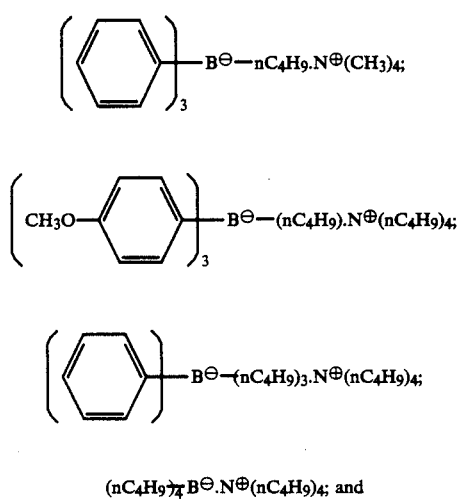
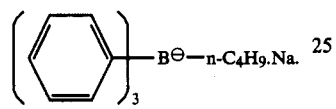
5. A photopolymerizable composition according to claim 1 wherein component (iii) is selected from the group of:
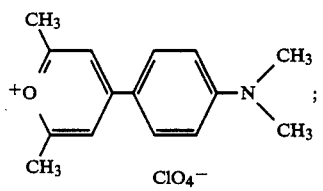
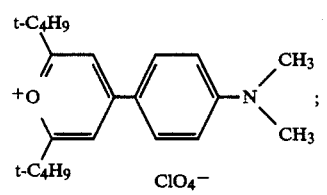
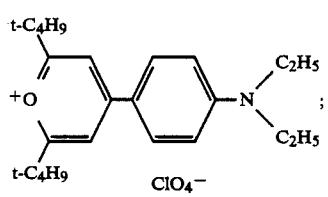
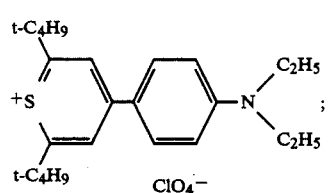
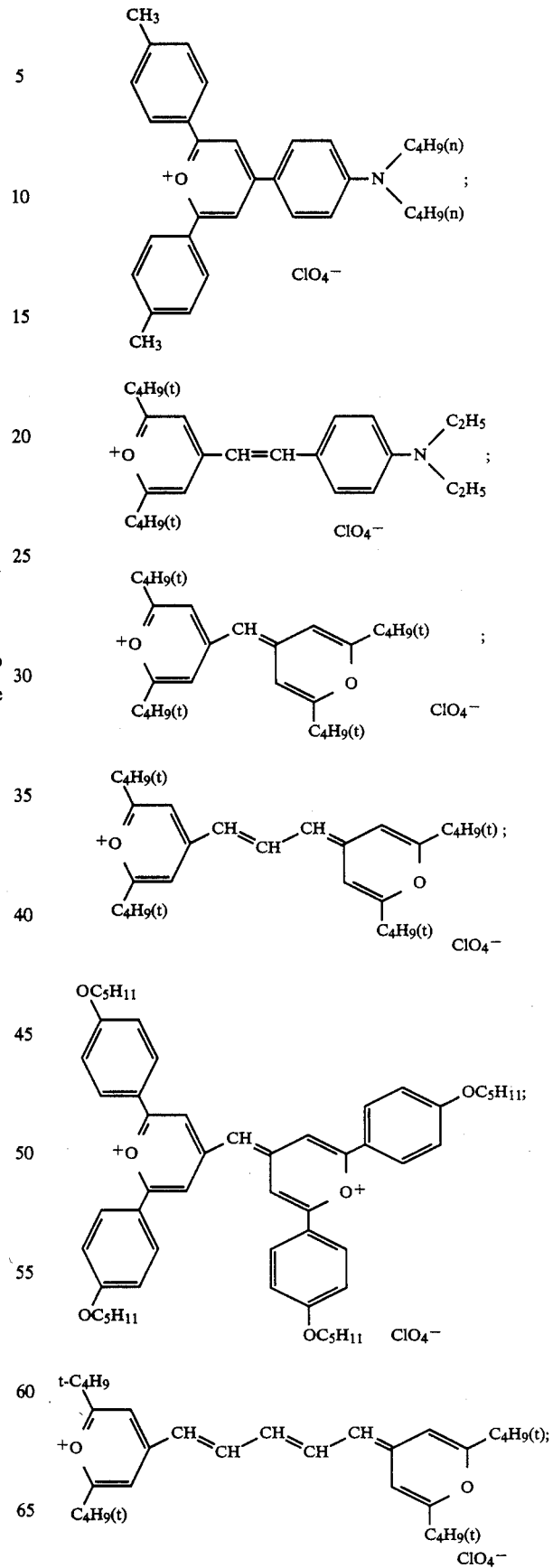

-continued

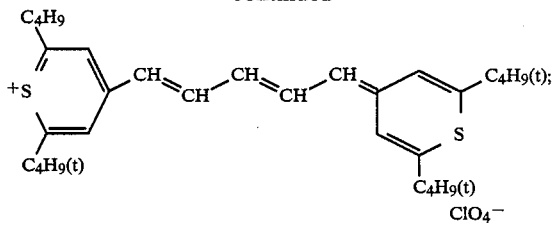

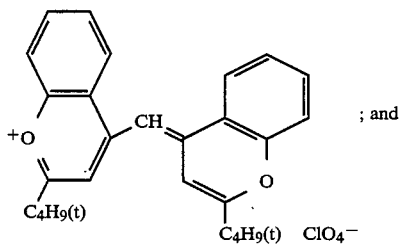
; and

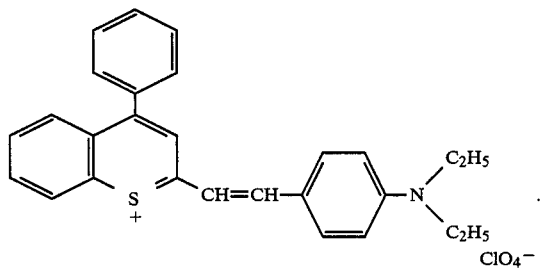

6. A photopolymerizable composition according to claim 1 wherein the combined amount of components (ii) and (iii) ranges from 0.01% to 60% by weight based on the total amount of component (i).

7. A photopolymerizable composition according to claim 1 wherein the combined amount of components (ii) and (iii) ranges from 1 to 30% by weight based on the total amount of component (i).

8. A photopolymerizable composition according to claim 1 further comprising an organic amine in an amount ranging from 50% to 200% by weight based on the total amount of components (ii) and (iii).

9. A photopolymerizable composition according to claim 8 wherein said organic amine is selected from at least one of triethanolamine, dimethylamine, diethanolaniline, ethyl p-dimethylaminobenzoate, and Michler's ketone.

10. A photopolymerizable composition according to claim 1 further comprising at least one of a hydrogen donating compound, a radical generating compound, and a thermal polymerization inhibitor.

11. A photopolymerizable composition according to claim 1 wherein said linear organic macromolecular polymer is present in an amount of 30 to 85% by weight based on the total composition and the weight ratio of component (i) to said linear organic macromolecular polymer ranges from 3/7 to 5/5.

12. A coated support comprising a dimensionally stable support having coated thereon the photopolymerizable composition of claim 1.

13. A coated support according to claim 12 wherein said support comprises aluminum.

14. A coated support according to claim 12 further comprising a protective layer coated on said photopolymerizable composition, and protective layer acting as an oxygen barrier.

15. A printing plate comprising the photopolymerizable composition of claim 1.

16. A photoresist comprising the photopolymerizable composition of claim 1.

* * * * *